United States Patent
Vaidya et al.

(10) Patent No.: US 10,205,084 B2
(45) Date of Patent: Feb. 12, 2019

(54) POWER HARVESTING

(71) Applicant: Intel Corporation, Santa Clara, CA (US)

(72) Inventors: Vaibhav Vaidya, Portland, OR (US); Suhwan Kim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 15/087,613

(22) Filed: Mar. 31, 2016

(65) Prior Publication Data

US 2017/0288415 A1 Oct. 5, 2017

(51) Int. Cl.
*H02J 7/00* (2006.01)
*H01L 41/113* (2006.01)
*H02N 2/18* (2006.01)
*H02J 7/34* (2006.01)

(52) U.S. Cl.
CPC ........ *H01L 41/1136* (2013.01); *H02J 7/0052* (2013.01); *H02J 7/345* (2013.01); *H02N 2/181* (2013.01); *H02N 2/186* (2013.01); *H02J 2007/0059* (2013.01)

(58) Field of Classification Search
CPC ...................................................... H02J 7/007
USPC ........................................................ 320/138
See application file for complete search history.

(56) References Cited

U.S. PATENT DOCUMENTS

| | | | | |
|---|---|---|---|---|
| 7,506,586 B1* | 3/2009 | Pereira | ................. | F42C 11/008 102/207 |
| 9,118,187 B1* | 8/2015 | Islam | ..................... | H02K 35/02 |
| 9,715,169 B2* | 7/2017 | Fujimura | ............ | G06F 17/5072 |
| 2007/0107766 A1* | 5/2007 | Langley, II | ............. | H02J 17/00 136/243 |
| 2007/0182362 A1* | 8/2007 | Trainor | ................. | H01M 10/46 320/101 |
| 2008/0036617 A1* | 2/2008 | Arms | .................... | B64C 27/006 340/679 |
| 2009/0039733 A1 | 2/2009 | Huovila et al. | | |
| 2009/0251099 A1* | 10/2009 | Brantner | ............... | H02J 7/0032 320/101 |
| 2010/0060231 A1* | 3/2010 | Trainor | .................. | H01G 11/14 320/103 |

(Continued)

FOREIGN PATENT DOCUMENTS

JP 2012165561 A 8/2012

OTHER PUBLICATIONS

PCT International Search Report, International Application No. PCT/US2017/015732, date of completion Apr. 26, 2017, 3 pages.

*Primary Examiner* — Suchin Parihar
(74) *Attorney, Agent, or Firm* — International IP Law Group, P.L.L.C.

(57) ABSTRACT

Techniques for harvesting electrical energy from a plurality of harvesters is disclosed. An example energy harvesting system includes a plurality of harvesters and a signal conditioning circuit selectively coupled to an output of each of the plurality of harvesters. The system also includes an energy storage element coupled to the output of the signal conditioning circuit to be charged by the plurality of harvesters through the signal conditioning circuit. The system also includes a controller to discharge a selected harvester to the signal conditioning circuit when an output of the selected harvester triggers a charge collection.

25 Claims, 7 Drawing Sheets

(56) References Cited

U.S. PATENT DOCUMENTS

| | | | |
|---|---|---|---|
| 2010/0315035 A1* | 12/2010 | Belov | H01M 10/46 |
| | | | 320/101 |
| 2011/0248846 A1* | 10/2011 | Belov | H04Q 9/00 |
| | | | 340/539.1 |
| 2011/0309721 A1* | 12/2011 | Moler | B81B 3/0021 |
| | | | 310/319 |
| 2012/0001518 A1* | 1/2012 | Moler | H02N 2/043 |
| | | | 310/319 |
| 2012/0194037 A1* | 8/2012 | Moler | H01L 41/113 |
| | | | 310/339 |
| 2013/0264870 A1 | 10/2013 | Keysar et al. | |
| 2013/0320932 A1 | 12/2013 | Zhou | |
| 2015/0123497 A1* | 5/2015 | Moss | H02K 35/06 |
| | | | 310/12.12 |
| 2015/0128733 A1* | 5/2015 | Taylor | H02J 7/025 |
| | | | 73/865.8 |
| 2015/0236619 A1 | 8/2015 | Hattori et al. | |
| 2016/0211439 A1* | 7/2016 | Najafi | H01L 41/0825 |
| 2016/0211742 A1* | 7/2016 | Mohammad | H02J 50/00 |
| 2016/0258758 A1* | 9/2016 | Houston | G01C 21/20 |
| 2017/0086672 A1* | 3/2017 | Tran | A61B 5/0022 |
| 2017/0182517 A9* | 6/2017 | Houston | B06B 1/166 |

* cited by examiner

300

400

POWER HARVESTING

TECHNICAL FIELD

This disclosure relates generally to techniques for power harvesting. Specific embodiments relate to techniques for harvesting power from a plurality of devices that generate electrical energy through vibrational power harvesting.

BACKGROUND

As computer miniaturization progresses, more products will be equipped with some form of sensing, computing, wireless communication abilities. The networking of objects through embedded electronics is sometimes referred to as Internet of Things (IoT). Electronics for enabling IoT can be embedded into a variety of objects, such as watches, bracelets, pens, keys, badges, and flash drives. Electronics such as sensors may be embedded in walls, furniture, pipes, and other area where there may not be easy physical access to the device. Such devices may use only small amounts of electrical power to function. Accordingly, harvesting ambient vibration energy can be a viable source of energy for self-powered IoT sensors and wearable devices, especially using piezoelectric transducers.

BRIEF DESCRIPTION OF DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DETAILED DESCRIPTION

The subject matter disclosed herein relates to techniques for power harvesting. As mentioned above, electronics are increasingly being embedded in a wide variety of objects, such as IoT devices and wearable electronics. In such devices, operating power is used for sensing, processing, and data transmission. Considering the increasing number of such objects and the possibility that some objects may not be easily accessible, powering the electronics in these objects may be cumbersome. For the electronics in some IoT devices and wearables, vibrational power harvesting techniques may be used to avoid the use of battery.

A piezoelectric transducer is one type of device that can be used for vibrational power harvesting. One large piezoelectric transducer can harvest a considerable amount of power. However, given random nature of ambient vibrations, having multiple piezoelectric transducers placed for different frequencies and/or vibrating axes can ensure more stable power generation.

In a system with a plurality of transducers, bridge rectifiers may be used to extract the vibrational energy from the transducers. However, bridge rectifiers limit the input power and each transducer is coupled to a different inductor, which conditions the current for each individual transducer separately.

The present disclosure provides a more efficient technique for harvesting vibrational energy from a plurality of transducers. The present disclosure describes a harvesting circuit that uses a single-inductor and can harvest energy from multiple input sources without the use of a rectifier. The harvesting circuit is able to harvest energy from multiple input sources in a much higher frequency than ambient vibrations and direct the energy to charge the battery with high efficiency and less hardware overhead.

Figure 1:
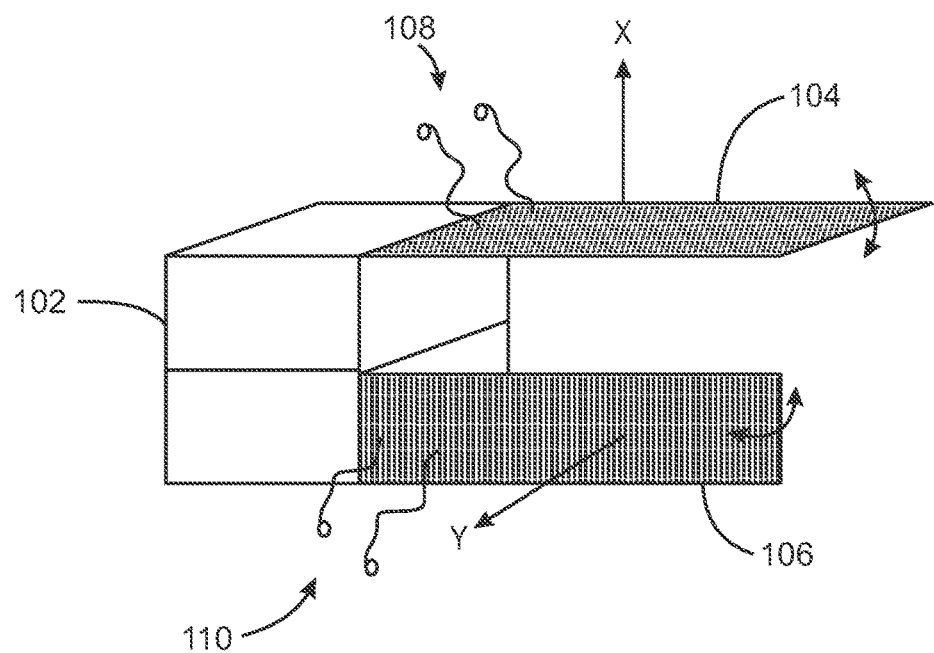
FIG. 1 is a simplified diagram of a harvester unit that can be used to harvest vibrational energy.

FIG. 1 is a simplified diagram of a harvester unit that can be used to harvest vibrational energy. As used herein, the term harvester refers to any type of device that can generate electrical energy from ambient sources such as mechanical vibrations. A piezoelectric transducer is one type of device that can be used as a vibrational harvester. Piezoelectric transducers generate electrical charge in response to applied mechanical stresses. The techniques described herein may be used with other types of harvesters.

The harvester unit 100 is able to generate an electrical charge in response to vibrational energy occurring at different planes of vibration. The harvester includes a vibrational body 102 and two cantilevered harvesters 104 and 106. Movement of the vibrational body causes deflection of the two cantilevered harvesters 104 and 106, each of which generates an electrical charge. Each harvester 104 and 106 has a pair of terminals 108 and 110 by which the electrical charge can be connected to a harvesting circuit that uses the electrical charge to charge a battery.

Each of the harvesters 104 and 106 is configured to be responsive to a different plane of vibration. Vibrations in the X direction cause deflection of the harvester 104, while vibrations on the Y direction cause deflection of the harvester 106. Although two harvesters are shown, an actual implementation may include additional harvesters configured to be responsive to additional planes of vibration.

Figure 2:
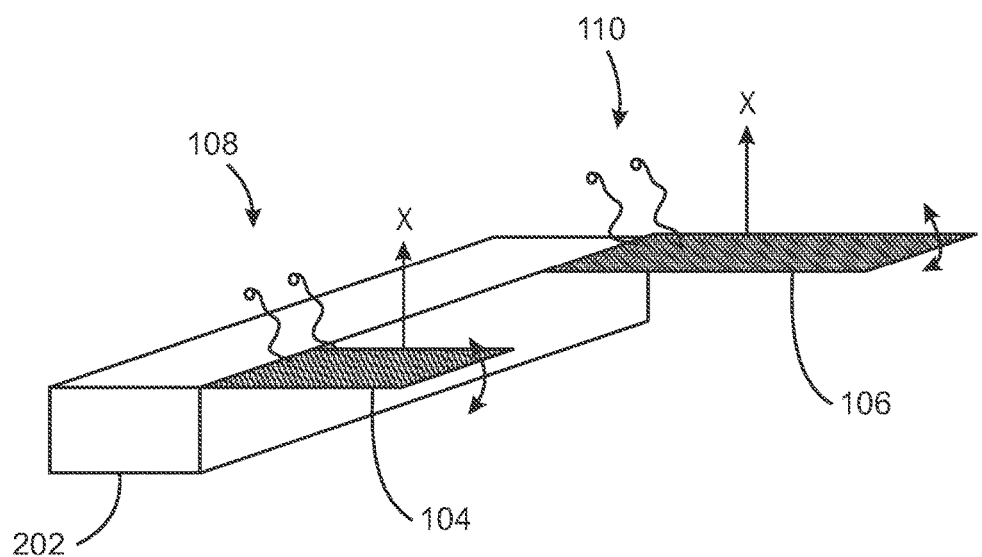
FIG. 2 is a simplified diagram of another harvester unit that can be used to harvest vibrational energy.

FIG. 2 is a simplified diagram of another harvester unit that can be used to harvest vibrational energy. The harvester unit 200 is able to generate an electrical charge in response to vibrational energy occurring at different frequencies of vibration. The harvester includes a vibrational body 202 and two cantilevered harvesters 204 and 206. As in the harvester unit of FIG. 1, movement of the vibrational body causes deflection of the two cantilevered harvesters 204 and 206, each of which generates an electrical charge. Each harvester 204 and 206 has a pair of terminals 208 and 210 by which the electrical charge can be connected to a harvesting circuit that uses the electrical charge to charge a battery.

Unlike the harvesters shown in FIG. 1, each of the harvesters 204 and 206 is configured to be responsive to the same plane of vibration. However, each of the harvesters 204 and 206 is configured to resonate at different vibrational frequencies. The smaller harvester 104 is configured to resonate at higher vibrational frequencies, while the larger harvester 106 is configured to resonate at lower vibrational frequencies. Each harvester 104 and 106 will be expected to generate a greater electrical charge when the vibrational frequency is closer to the resonant frequency of the harvester.

Although two harvesters are shown, an actual implementation may include additional harvesters of different sizes and configured to resonate at a variety of vibrational frequencies. Furthermore, a harvesting unit in accordance with the present techniques may include a combination of harvesters configured to be responsive to the different planes of vibration and different resonant frequencies. Furthermore, the techniques described herein can also be implemented with broadband harvesters that are not limited to a particular resonant frequency.

Figure 3:
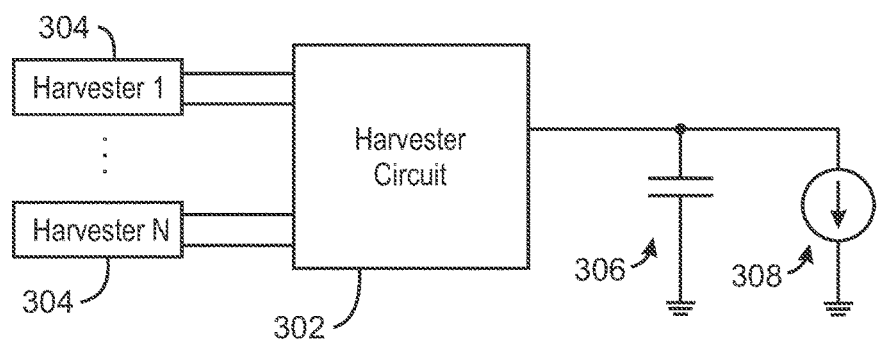
FIG. 3 is a block diagram of an energy harvesting system.

FIG. 3 is a block diagram of an energy harvesting system. The system 300 includes a harvester circuit 302 configured to receive an electrical charge from a plurality of harvesters 304. The harvester circuit 302 collects a charge from each of the harvesters 304 and generates an electrical output that is used to charge a battery 306. The techniques described herein can also be used with other types of energy storage elements such as capacitors. The output from the harvester circuit 302 can also be used to power an electrical workload 308 directly. Each harvester 304 may be a separate unit, or the plurality of harvesters 304 may be included in single unit with several output terminals, in which case, each harvester 304 may represent a different output terminal of the same harvester unit.

The harvesters 304 can be any suitable number and type of harvesters. For example, the harvesters 304 can include any suitable combination of the harvesters 104 and 106 and others. Each harvester may be configured to respond to a specific plane of vibration or resonant frequency. In some examples, the harvesters include a first set of harvesters that resonate at a plurality of vibrational frequencies and a second set of harvesters oriented to be responsive to a plurality of planes of vibration.

The harvester circuit 302 collects the charge and delivers it to the output all without the use of a rectifier. Furthermore, only a single inductor is used to condition the collected charge, rather than having a separate inductor for each harvester 304. The harvester circuit 302 is able to detect the charge level for each harvester, for example by detecting the voltage across each harvester's output terminals. The harvester circuit 302 discharges a selected harvester to the signal conditioning circuit when the detected output of the selected harvester triggers a charge collection. A more detailed example of a harvester circuit 302 is shown in FIG. 4.

Figure 4:
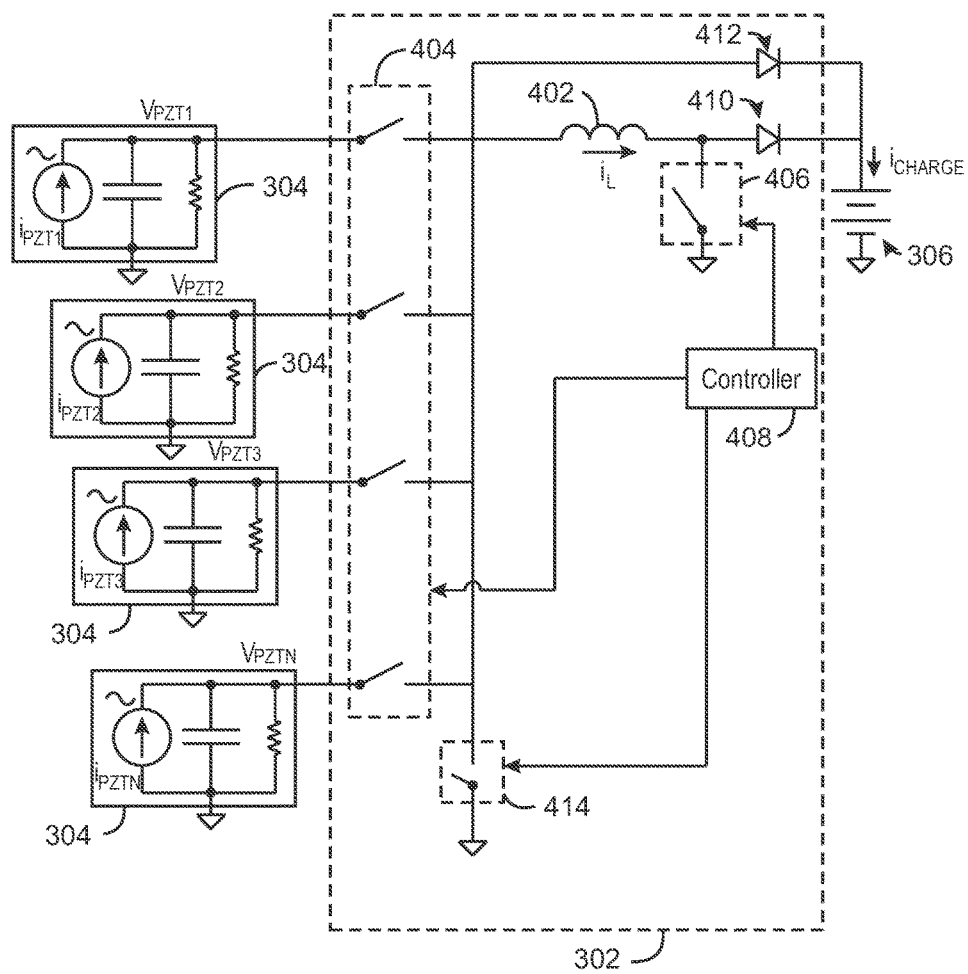
FIG. 4 is a more detailed block diagram of example energy harvesting system 400.

FIG. 4 is a more detailed block diagram of example energy harvesting system 400. The energy harvesting system 400 includes four harvesters 304. Each harvester 304 shown in FIG. 4 is represented as a lumped element model with a parallel current source, capacitor, and resistor.

The harvester circuit 302 includes a single inductor 402, which serves as a signal conditioner for all of the harvesters 304 in the system 302. The output of each harvester 304 is coupled to the inductor 402 through a corresponding switch 404. When a switch 404 is closed, the charge generated by the corresponding harvester 304 is coupled to the inductor 402. The inductor 402 is a signal conditioning circuit that temporarily stores the electrical energy received from the harvester 304. Other signal conditioning circuits could also be used in place of the inductor 402.

The harvester circuit 302 also includes a switch 406 that controls the charging and discharging of the inductor. The switches 404 and the switch 406 may be controlled by a controller 408. The controller 408 may be any suitable electronic device, such as a processor, microcontroller, Field Programmable Gate Array (FPGA), and others. The controller 408 is also able to detect the level of charge that is present on each harvester 304. For example, the controller 408 may detect a voltage level across the output terminals of the harvester 304. The controller 408 may be configured to discharge a selected harvester to the signal conditioning circuit when an output of the selected harvester triggers a charge collection. For example, a harvester may trigger a charge collection if an output voltage of the selected harvester indicates a local maxima of the output voltage, as described further in relation to FIGS. 5 and 6. Other implementations are also possible. For example, a harvester may trigger a charge collection if an output voltage of the selected harvester reaches a predetermined threshold voltage level.

During the charging of the inductor, the switch 406 is closed and one or more of the switches 404 is closed depending on which the harvester or harvesters have a charge to be transferred to the inductor. To discharge the inductor, the switch 406 and all of the switches 404 are open-circuited. The electrical energy stored by the inductor 402 will then discharge to the battery 306.

The energy stored by the inductor 402 may be due to current of either polarity depending on the polarity of the charge received from the harvester 304. The positive polarity is indicated with by the arrow labeled $i_L$. The diodes 410 and 412 enable the inductor to charge the battery with the correct polarity regardless of the polarity of the current through the inductor 402. For the positive polarity, current will flow through the diode 410 to the battery 306 when both the switches 404 and 406 are opened. For the negative polarity, current will flow through the diode 412 to the battery 306 when both the switches 404 and 406 are opened.

Each of the harvesters 304 may be operating at different frequencies and different phases. The controller 304 can detect the voltage level of a particular harvester and use this information to determine when to transfer the charge to the indicator 402. In some examples, the controller 408 may discharge the harvester 304 at a time when the harvester's output voltage is at or near a local maxima. The operation of the harvester circuit 302 may be better understood with reference to FIGS. 5 and 6.

Figure 5:
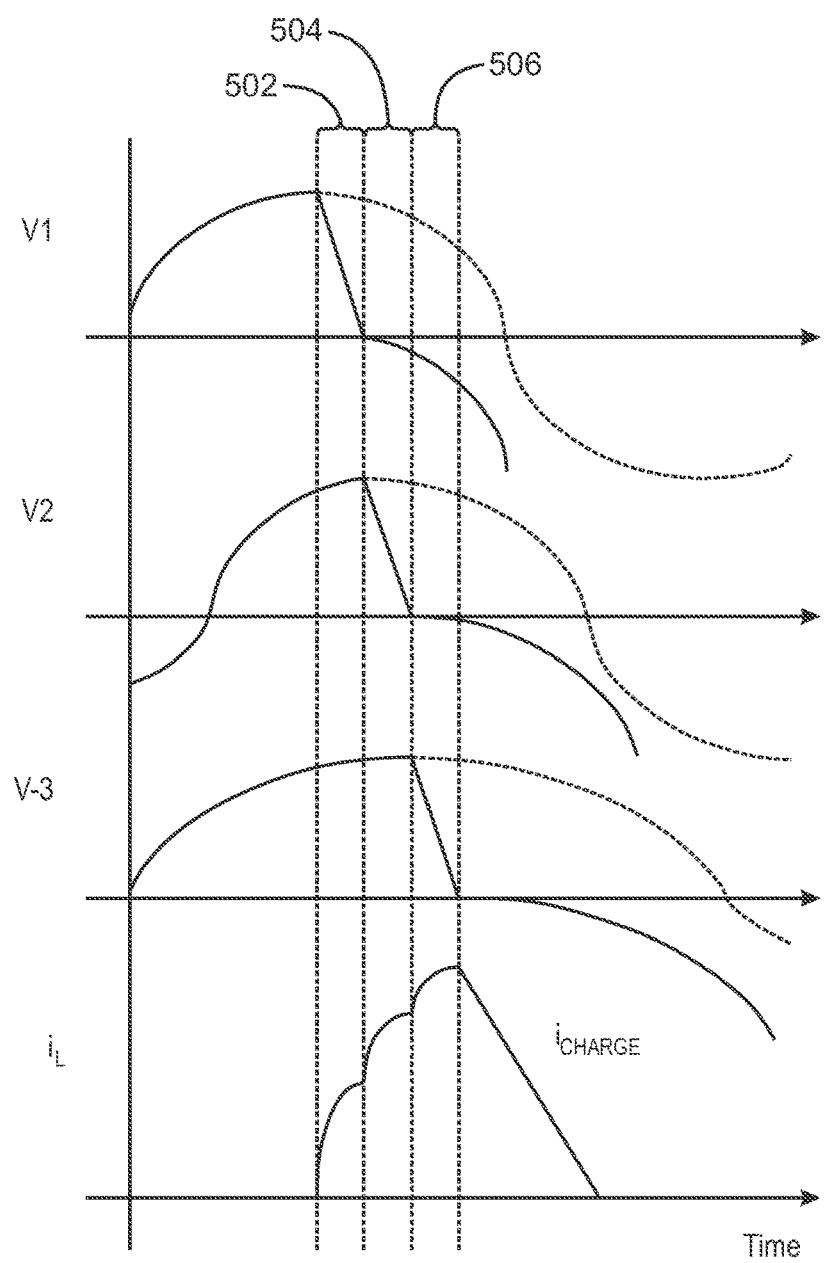
FIG. 5 is a graph showing possible electrical characteristics of the harvester circuit during operation.

FIG. 5 is a graph showing possible electrical characteristics of the harvester circuit during operation. In describing the graph, the following description will also make reference to FIG. 4. The Y-axis represents voltage and the X-axis represents time. Each voltage V1, V2, and V3 represents the voltage and current across the terminals of one of three harvesters. The dotted line represents the hypothetical voltage that would exist if the electrical charge generated by the harvester were never discharged. The solid line represents the actual voltage that results from the generation of an electrical charge and the eventual discharging of the harvester to the inductor.

The voltages V1, V2, and V3 are superimposed over the current in the inductor 402. Graph 500 shows an example of cumulative harvesting, wherein the inductor accumulates a charge from multiple harvesters before discharging to the battery. Three time windows are shown. In the first time window 502, the voltage V1 reaches a local maxima. The controller 408 can be configured to sense when each harvester is at a voltage maxima, for example, by computing the slope of the voltage curve over time. When the controller 408 senses the local maxima, the controller closes the switch corresponding to that harvester. As a result, the charge is transferred from the harvester to the inductor as indicated by the drop in V1 from the start of the window to the end of the window. Over the same time window, the inductor current, $I_L$, increases in proportion to the amount of charge received from the harvester.

In the second time window 504, the voltage V2 reaches a local maxima. The controller senses that local maxima and closes the switch corresponding to that harvester and the charge is transferred from the harvester to the inductor 402 as indicated by the drop in V2 from the start of the window to the end of the window. Meanwhile, the inductor current, $I_L$, increases again in proportion to the amount of charge received from the second harvester. During the third time window 506, the same process is repeated for the third harvester corresponding to V3.

During all three time windows, the switch 406 is closed so that the electrical charge will induce a current in the inductor 402. At the end of the third time widow, the inductor is discharged by opening the switch 406 and all of the switches 404 and closing the switch 414. The time for discharging the inductor may be determined in a number of ways. For example, the inductor discharge may be triggered when the voltage across the harvester 304 reaches a threshold voltage level or when the current across the inductor reaches a threshold current level. Current in the inductor can be detected, for example, by the voltage drop across the switch or diode that the inductor current is flowing through. The process represented in FIG. 5 can also be repeated for negative cycles.

Figure 6:
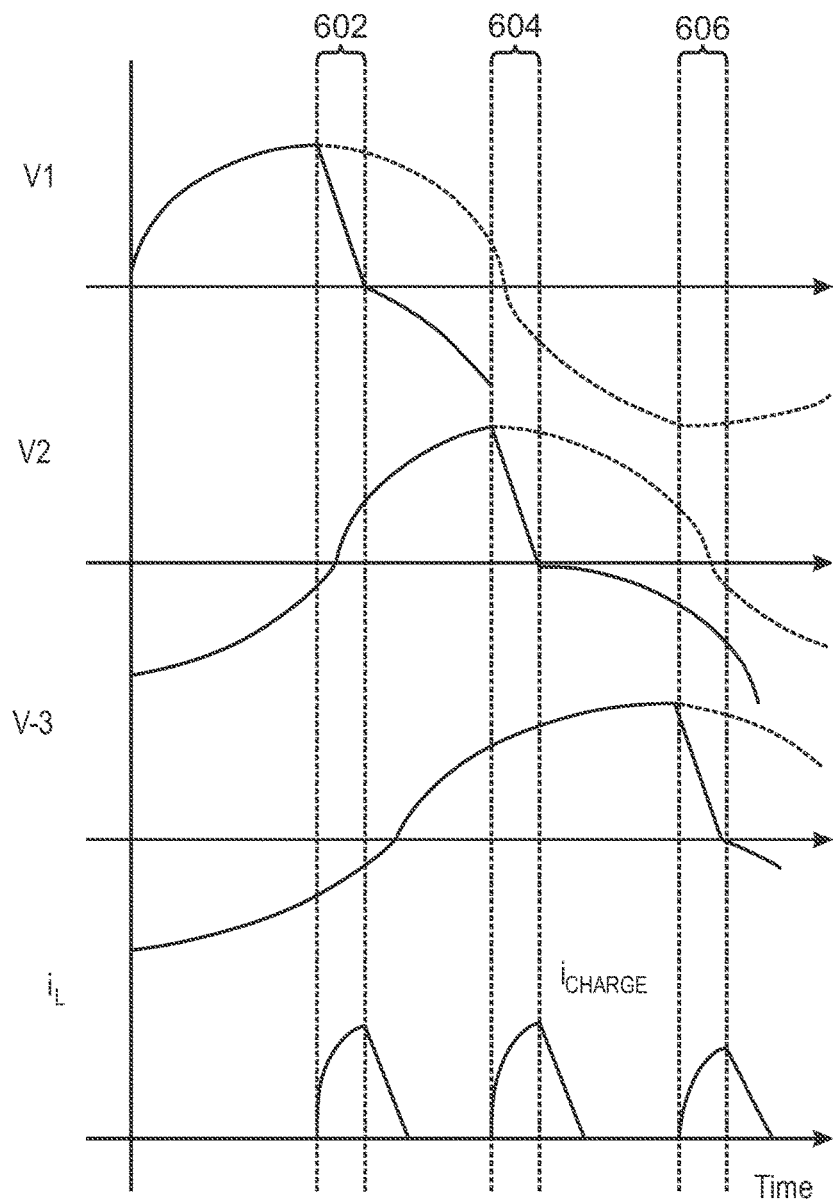
FIG. 6 is another graph showing possible electrical characteristics of the harvester circuit during operation.

FIG. 6 is another graph showing possible electrical characteristics of the harvester circuit during operation. As in FIG. 5, each voltage V1, V2, and V3 represents the voltage across the terminals of one of three harvesters. The dotted line represents the hypothetical voltage that would exist if the electrical charge generated by the harvester were never discharged. The solid line represents the actual voltage that results from the generation of an electrical charge and the eventual discharging of the harvester. In the example shown in FIG. 6, there is more time separation between the times that each of the voltage waveforms reach the local maxima. In this example, the discharging of the inductor is time separated, meaning that the controller discharges the inductor 402 separately after receiving a charge from a single harvester rather than collecting a larger charge from additional harvesters.

Three time windows are shown. In the first time window 602, the voltage V1 reaches a local maxima and the controller closes the switch corresponding to that harvester to charge the inductor 402. At the end of the time window, the inductor is discharged to the battery. The same process is repeated for time windows 604 and 606.

The graphs 500 and 600 are provided as examples of waveforms that may be generated by a set of vibrational harvesters. It will be appreciated that the actual waveforms generated by the harvesters may be more varied with respect the relative frequencies, amplitudes, or phase separations between the waveforms. In an actual implementation, the harvester circuit 302 may perform a combination of cumulative harvesting and time separated harvesting depending on the waveforms exhibited by the harvesters. In this way, the harvester circuit 302 is able to gather the resulting charge despite the random nature of the vibrations that may be relied on to produce the charge. Additionally, the harvester circuit 302 may also precharge the harvester 304 in a direction that increases the energy that can be harvested from the inductor 402. In this case, the actual waveforms across the harvester 304 may appear different.

Figure 7:
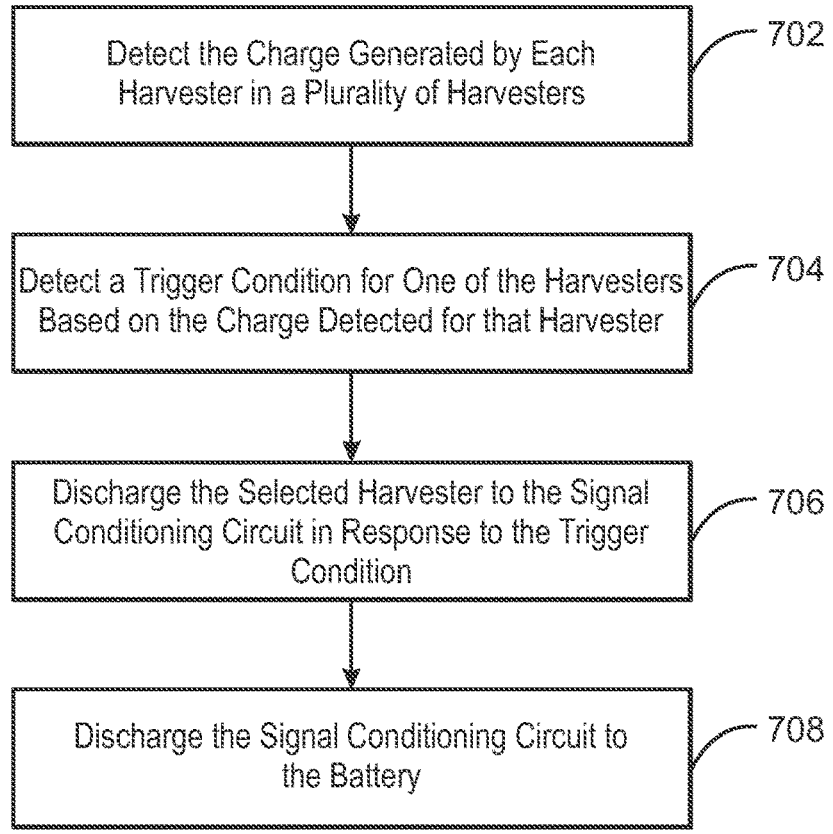
FIG. 7 is a process flow diagram of a method of operating a harvesting circuit.

FIG. 7 is a process flow diagram of a method of operating a harvesting circuit. The method 700 may be performed by the energy harvesting system shown in FIG. 4. The method may begin at block 702.

At block 702, the charge generated by each harvester is detected. The charge may be detected by detecting the voltage across each of the harvester's output terminals.

At block 704, a trigger condition is detected for one of the harvesters. The trigger condition may be detected based on the charge level detected for that harvester. For example, the output of the selected harvester may trigger the charge collection if the output of the harvester reaches a local maxima or if the output reaches a threshold.

At block 706, the harvester that triggered the charge collection is discharged to a signal conditioning circuit in response to the trigger condition. The controller can cause the harvester to be discharged by closing a switch that couples the harvester to the signal conditioning circuit.

At block 708, the signal conditioning circuit is discharged to the battery. The signal conditioning circuit can be discharged to the battery by decoupling the signal conditioning circuit from the harvesters and coupling the signal conditioning circuit to the battery. In some cases, the signal conditioning circuit may be discharged to the battery after the selected harvester is discharged and before discharging another harvester to the signal conditioning circuit. In some cases, the signal conditioning circuit may collect a charge from two or more harvesters before being discharged to the signal conditioning circuit. In this scenario, blocks 704 and 706 would be repeated two or more times for different harvesters before the process flow would advance to block 708.

The method 700 should not be interpreted as meaning that the blocks are necessarily performed in the order shown. Furthermore, fewer or greater actions can be included in the method 700 depending on the design considerations of a particular implementation.

EXAMPLES

Example 1 is an energy harvesting system. The system includes a plurality of harvesters a signal conditioning circuit selectively coupled to an output of each of the plurality of harvesters; an energy storage element coupled to an output of the signal conditioning circuit and to be charged by the plurality of harvesters through the signal conditioning circuit; and a controller to discharge a selected harvester of the plurality of harvesters to the signal conditioning circuit when an output of the selected harvester triggers a charge collection.

Example 2 includes the system of example 1, including or excluding optional features. In this example, the plurality of harvesters includes at least one harvester configured to convert vibrational energy into electrical energy.

Example 3 includes the system of any one of examples 1 to 2, including or excluding optional features. In this example, the plurality of harvesters includes a first harvester responsive to vibrations occurring in a first plane and a second harvester responsive to vibrations occurring in a second plane.

Example 4 includes the system of any one of examples 1 to 3, including or excluding optional features. In this example, the plurality of harvesters includes a first harvester to resonate at a first vibrational frequency and a second harvester to resonate at a second vibrational frequency.

Example 5 includes the system of any one of examples 1 to 4, including or excluding optional features. In this example, the plurality of harvesters includes a first set of harvesters and a second set of harvesters, the first set of harvesters including harvesters that resonate at a plurality of vibrational frequencies, and the second set of harvesters oriented to be responsive to a plurality of planes of vibration.

Example 6 includes the system of any one of examples 1 to 5, including or excluding optional features. In this example, the output of the selected harvester triggers the charge collection when the output reaches a local maxima.

Example 7 includes the system of any one of examples 1 to 6, including or excluding optional features. In this example, the output of the selected harvester triggers the charge collection when the output reaches a threshold.

Example 8 includes the system of any one of examples 1 to 7, including or excluding optional features. In this example, after the selected harvester is discharged, the controller is to couple the signal conditioning circuit to the energy storage element to transfer stored energy from the signal conditioning circuit to the energy storage element.

Example 9 includes the system of any one of examples 1 to 8, including or excluding optional features. In this example, after the selected harvester is discharged and before the signal conditioning circuit is discharged to the energy storage element, the controller is to discharge another harvester of the plurality of harvesters to the signal conditioning circuit in response to the other harvester triggering a charge collection.

Example 10 includes the system of any one of examples 1 to 9, including or excluding optional features. In this example, the signal conditioning circuit is an inductor.

Example 11 is a method of charging a battery. The method includes detecting a voltage generated by each harvester in a plurality of harvesters; detecting a trigger condition for a selected harvester of the plurality of harvesters based on the charge detected for the selected harvester; discharging the selected harvester to a signal conditioning circuit in response to the trigger condition; and discharging the signal conditioning circuit to the battery.

Example 12 includes the method of example 11, including or excluding optional features. In this example, the plurality of harvesters includes at least one harvester configured to convert vibrational energy into electrical energy.

Example 13 includes the method of any one of examples 11 to 12, including or excluding optional features. In this example, the plurality of harvesters includes a first harvester responsive to vibrations occurring in a first plane and a second harvester responsive to vibrations occurring in a second plane.

Example 14 includes the method of any one of examples 11 to 13, including or excluding optional features. In this example, the plurality of harvesters includes a first harvester to resonate at a first vibrational frequency and a second harvester to resonate at a second vibrational frequency.

Example 15 includes the method of any one of examples 11 to 14, including or excluding optional features. In this example, the plurality of harvesters includes a first set of harvesters and a second set of harvesters, the first set of harvesters including harvesters that resonate at a plurality of vibrational frequencies, and the second set of harvesters oriented to be responsive to a plurality of planes of vibration.

Example 16 includes the method of any one of examples 11 to 15, including or excluding optional features. In this example, detecting the trigger condition for the selected harvester includes detecting a local maxima in the voltage generated by the selected harvester.

Example 17 includes the method of any one of examples 11 to 16, including or excluding optional features. In this example, detecting the trigger condition for the selected harvester includes detecting that the voltage generated by selected harvester has reached a threshold.

Example 18 includes the method of any one of examples 11 to 17, including or excluding optional features. In this example, discharging the signal conditioning circuit to the battery includes coupling the signal conditioning circuit to the battery after the selected harvester is discharged and before discharging another harvester of the plurality of harvesters to the signal conditioning circuit.

Example 19 includes the method of any one of examples 11 to 18, including or excluding optional features. In this example, the method includes discharging another harvester of the plurality of harvesters to the signal conditioning circuit after the selected harvester is discharged and before the signal conditioning circuit is discharged to the battery.

Example 20 includes the method of any one of examples 11 to 19, including or excluding optional features. In this example, the signal conditioning circuit is an inductor.

Example 21 is an energy harvesting circuit. The energy harvesting circuit includes a plurality of inputs to receive electrical energy from a plurality of harvesters a signal conditioning circuit to store energy received from the plurality of harvesters before transferring the stored energy to a battery; a plurality of switches to selectively couple each of the plurality of harvesters to the signal conditioning circuit; and a controller to discharge a selected harvester of the plurality of harvesters to the signal conditioning circuit when a voltage of the selected harvester triggers a charge collection.

Example 22 includes the energy harvesting circuit of example 21, including or excluding optional features. In this example, the plurality of harvesters includes at least one harvester configured to convert vibrational energy into electrical energy.

Example 23 includes the energy harvesting circuit of any one of examples 21 to 22, including or excluding optional features. In this example, the plurality of harvesters includes a first harvester responsive to vibrations occurring in a first plane and a second harvester responsive to vibrations occurring in a second plane.

Example 24 includes the energy harvesting circuit of any one of examples 21 to 23, including or excluding optional features. In this example, the plurality of harvesters includes a first harvester to resonate at a first vibrational frequency and a second harvester to resonate at a second vibrational frequency.

Example 25 includes the energy harvesting circuit of any one of examples 21 to 24, including or excluding optional features. In this example, the plurality of harvesters includes a first set of harvesters and a second set of harvesters, the first set of harvesters including harvesters that resonate at a plurality of vibrational frequencies, and the second set of harvesters oriented to be responsive to a plurality of planes of vibration.

Example 26 includes the energy harvesting circuit of any one of examples 21 to 25, including or excluding optional features. In this example, the selected harvester triggers a charge collection when the voltage generated by the selected harvester exhibits a local maxima.

Example 27 includes the energy harvesting circuit of any one of examples 21 to 26, including or excluding optional features. In this example, the selected harvester triggers a charge collection when the voltage generated by the selected harvester has reached a threshold.

Example 28 includes the energy harvesting circuit of any one of examples 21 to 27, including or excluding optional features. In this example, discharging the signal conditioning circuit to the battery includes coupling the signal conditioning circuit to the battery after the selected harvester is discharged and before discharging another harvester of the plurality of harvesters to the signal conditioning circuit.

Example 29 includes the energy harvesting circuit of any one of examples 21 to 28, including or excluding optional features. In this example, the energy harvesting circuit includes discharging another harvester of the plurality of harvesters to the signal conditioning circuit after the selected harvester is discharged and before the signal conditioning circuit is discharged to the battery.

Example 30 includes the energy harvesting circuit of any one of examples 21 to 29, including or excluding optional features. In this example, the signal conditioning circuit is an inductor.

Example 31 is an apparatus for harvesting vibrational energy. The apparatus includes means for detecting a voltage generated by each harvester in a plurality of harvesters; means for detecting a trigger condition for a selected harvester of the plurality of harvesters based on the charge detected for the selected harvester; means for discharging the selected harvester to a signal conditioning circuit in response to the trigger condition; and means for discharging the signal conditioning circuit to a battery.

Example 32 includes the apparatus of example 31, including or excluding optional features. In this example, the plurality of harvesters includes at least one harvester configured to convert vibrational energy into electrical energy.

Example 33 includes the apparatus of any one of examples 31 to 32, including or excluding optional features. In this example, the plurality of harvesters includes a first harvester responsive to vibrations occurring in a first plane and a second harvester responsive to vibrations occurring in a second plane.

Example 34 includes the apparatus of any one of examples 31 to 33, including or excluding optional features. In this example, the plurality of harvesters includes a first harvester to resonate at a first vibrational frequency and a second harvester to resonate at a second vibrational frequency.

Example 35 includes the apparatus of any one of examples 31 to 34, including or excluding optional features. In this example, the plurality of harvesters includes a first set of harvesters and a second set of harvesters, the first set of harvesters including harvesters that resonate at a plurality of vibrational frequencies, and the second set of harvesters oriented to be responsive to a plurality of planes of vibration.

Example 36 includes the apparatus of any one of examples 31 to 35, including or excluding optional features. In this example, the means for detecting the trigger condition for the selected harvester includes means for detecting a local maxima in the voltage generated by the selected harvester.

Example 37 includes the apparatus of any one of examples 31 to 36, including or excluding optional features. In this example, the means for detecting the trigger condition for the selected harvester includes means for detecting that the voltage generated by selected harvester has reached a threshold.

Example 38 includes the apparatus of any one of examples 31 to 37, including or excluding optional features. In this example, the means for discharging the signal conditioning circuit to the battery includes means for coupling the signal conditioning circuit to the battery after the selected harvester is discharged and before discharging another harvester of the plurality of harvesters to the signal conditioning circuit.

Example 39 includes the apparatus of any one of examples 31 to 38, including or excluding optional features. In this example, the apparatus includes means for discharging another harvester of the plurality of harvesters to the signal conditioning circuit after the selected harvester is discharged and before the signal conditioning circuit is discharged to the battery.

Example 40 includes the apparatus of any one of examples 31 to 39, including or excluding optional features. In this example, the signal conditioning circuit is an inductor.

Some embodiments may be implemented in one or a combination of hardware, firmware, and software. Some embodiments may also be implemented as instructions stored on the tangible non-transitory machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An energy harvesting system, comprising:
   a plurality of harvesters a signal conditioning circuit selectively coupled to an output of each of the plurality of harvesters;
   an energy storage element coupled to an output of the signal conditioning circuit and to be charged by the plurality of harvesters through the signal conditioning circuit; and
   a controller to detect a charge level for each of the plurality of harvesters and discharge a selected harvester of the plurality of harvesters by coupling the selected harvester to the signal conditioning circuit based on the charge level of the selected harvester.

2. The energy harvesting system of claim 1, wherein the plurality of harvesters comprise at least one harvester configured to convert vibrational energy into electrical energy.

3. The energy harvesting system of claim 1, wherein the plurality of harvesters comprises a first harvester responsive to vibrations occurring in a first plane and a second harvester responsive to vibrations occurring in a second plane.

4. The energy harvesting system of claim 1, wherein the plurality of harvesters comprises a first harvester to resonate at a first vibrational frequency and a second harvester to resonate at a second vibrational frequency.

5. The energy harvesting system of claim 1, wherein the plurality of harvesters comprises a first set of harvesters and a second set of harvesters, the first set of harvesters comprising harvesters that resonate at a plurality of vibrational frequencies, and the second set of harvesters oriented to be responsive to a plurality of planes of vibration.

6. The energy harvesting system of claim 1, wherein the controller is to discharge the selected harvester when the charge level reaches a local maxima.

7. The energy harvesting system of claim 1, wherein the controller is to discharge the selected harvester when the charge level reaches a threshold.

8. The energy harvesting system of claim 1, wherein, after the selected harvester is discharged, the controller is to couple the signal conditioning circuit to the energy storage element to transfer stored energy from the signal conditioning circuit to the energy storage element.

9. The energy harvesting system of claim 1, wherein, after the selected harvester is discharged and before the signal conditioning circuit is discharged to the energy storage element, the controller is to discharge an other harvester of the plurality of harvesters to the signal conditioning circuit based on the charge level of the other harvester.

10. The energy harvesting system of claim 1, wherein the signal conditioning circuit is an inductor.

11. A method of charging a battery, comprising:
    detecting a voltage generated by each harvester in a plurality of harvesters;
    detecting a trigger condition for a selected harvester of the plurality of harvesters based on the voltage detected for the selected harvester;
    discharging the selected harvester by coupling the selected harvester to a signal conditioning circuit in response to the trigger condition; and
    discharging the signal conditioning circuit to the battery.

12. The method of claim 11, wherein the plurality of harvesters comprise at least one harvester configured to convert vibrational energy into electrical energy.

13. The method of claim 11, wherein the plurality of harvesters comprises a first harvester responsive to vibrations occurring in a first plane and a second harvester responsive to vibrations occurring in a second plane.

14. The method of claim 11, wherein the plurality of harvesters comprises a first harvester to resonate at a first vibrational frequency and a second harvester to resonate at a second vibrational frequency.

15. The method of claim 11, wherein the plurality of harvesters comprises a first set of harvesters and a second set of harvesters, the first set of harvesters comprising harvesters that resonate at a plurality of vibrational frequencies, and the second set of harvesters oriented to be responsive to a plurality of planes of vibration.

16. The method of claim 11, wherein detecting the trigger condition for the selected harvester comprises detecting a local maxima in the voltage generated by the selected harvester.

17. The method of claim 11, wherein detecting the trigger condition for the selected harvester comprises detecting that the voltage generated by selected harvester has reached a threshold.

18. The method of claim 11, wherein discharging the signal conditioning circuit to the battery comprises coupling the signal conditioning circuit to the battery after the selected harvester is discharged and before discharging an other harvester of the plurality of harvesters to the signal conditioning circuit.

19. The method of claim 11, comprising discharging an other harvester of the plurality of harvesters to the signal conditioning circuit after the selected harvester is discharged and before the signal conditioning circuit is discharged to the battery.

20. The method of claim 11, wherein the signal conditioning circuit is an inductor.

21. An energy harvesting circuit comprising:
    an plurality of inputs to receive electrical energy from a plurality of harvesters;
    a signal conditioning circuit to store energy received from the plurality of harvesters before transferring the stored energy to a battery;
    a plurality of switches to selectively couple each of the plurality of harvesters to the signal conditioning circuit; and
    a controller to detect a charge level for each of the plurality of harvesters and discharge a selected harvester of the plurality of harvesters by controlling the plurality of switches to couple the selected harvester to the signal conditioning circuit when a voltage based on the charge level of the selected harvester triggers a charge collection.

22. The energy harvesting circuit of claim 21, wherein the plurality of harvesters comprise at least one harvester configured to convert vibrational energy into electrical energy.

23. The energy harvesting circuit of claim 21, wherein the plurality of harvesters comprises a first harvester responsive to vibrations occurring in a first plane and a second harvester responsive to vibrations occurring in a second plane.

24. The energy harvesting circuit of claim 21, wherein the plurality of harvesters comprises a first harvester to resonate at a first vibrational frequency and a second harvester to resonate at a second vibrational frequency.

25. The energy harvesting circuit of claim 21, wherein the plurality of harvesters comprises a first set of harvesters and a second set of harvesters, the first set of harvesters comprising harvesters that resonate at a plurality of vibrational frequencies, and the second set of harvesters oriented to be responsive to a plurality of planes of vibration.

* * * * *